United States Patent
Lui et al.

(10) Patent No.: US 6,548,356 B2
(45) Date of Patent: Apr. 15, 2003

(54) THIN FILM TRANSISTOR

(75) Inventors: Basil Lui, Cambridge (GB); Piero Migliorato, Cambridge (CA); Ichio Yudasaka, Suwa (JP); Mitsutoshi Miyasaka, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/914,915

(22) PCT Filed: Jan. 2, 2001

(86) PCT No.: PCT/GB01/00003
§ 371 (c)(1),
(2), (4) Date: Dec. 13, 2001

(87) PCT Pub. No.: WO01/50514
PCT Pub. Date: Jul. 12, 2001

(65) Prior Publication Data
US 2002/0158269 A1 Oct. 31, 2002

(30) Foreign Application Priority Data
Jan. 7, 2000 (GB) .............................................. 0000378

(51) Int. Cl.$^7$ ............................................ H01L 21/336
(52) U.S. Cl. ....................... 438/266; 438/264; 438/257; 257/315; 257/321; 257/336
(58) Field of Search ................. 438/257, 258, 438/264–267, 48, 128, 149, 151, 157, 283, 263, 44, 594, 266, 372; 257/315, 321, 57, 59, 72, 69, 369, 351, 344, 347, 204, 206, 372, 365, 408, 66, 444, 448, 336

(56) References Cited

U.S. PATENT DOCUMENTS

| | | | |
|---|---|---|---|
| 5,198,379 A | 3/1993 | Adan | |
| 5,250,835 A | 10/1993 | Izawa | |
| 5,528,056 A * | 6/1996 | Shimada et al. | ............. 257/351 |
| 5,658,808 A | 8/1997 | Lin | |
| 5,674,767 A * | 10/1997 | Lee et al. | ...................... 437/43 |
| 5,739,549 A | 4/1998 | Takemura et al. | |
| 5,874,745 A * | 2/1999 | Kuo | ........................... 257/324 |
| 5,895,935 A | 4/1999 | Yamazaki et al. | |
| 5,929,464 A | 7/1999 | Yamazaki et al. | |
| 6,235,559 B1 * | 5/2001 | Kuo | ........................... 438/149 |

FOREIGN PATENT DOCUMENTS

| | | |
|---|---|---|
| EP | 0 871 227 A2 | 10/1988 |
| EP | 0 348 209 A2 | 12/1989 |
| EP | 0 359 528 A2 | 3/1990 |
| EP | 0 589 478 A2 | 3/1994 |
| EP | 0723 286 A2 | 7/1996 |
| EP | 0 738 012 A2 | 10/1996 |
| EP | 0 795 904 A2 | 9/1997 |
| EP | 0 797 246 A1 | 9/1997 |
| EP | 0 871 227 A2 | 10/1998 |
| WO | WO 96/17385 | 6/1996 |

* cited by examiner

*Primary Examiner*—David Nelms
*Assistant Examiner*—Long Tran
(74) *Attorney, Agent, or Firm*—Oliff & Berridge, PLC

(57) ABSTRACT

A semiconductor transistor comprising a substrate having an active layer formed thereon, a source and a drain formed in the active layer, a gate insulating layer formed on the active layer and a gate electrode formed on the insulating layer, wherein the gate electrode is split, the active layer has a doped region located between the source and the drain and aligned with the split in the gate electrode, and the gate electrode is aligned with the drain so as not to overlap the drain. The transistor may be formed using a method comprising the steps of: providing a semiconductor layer in which the source and drain are to be formed; forming a gate insulating layer on the semiconductor layer; forming a split gate electrode on the gate insulating layer; and using the split gate electrode as a mask in the doping of a portion of the semiconductor layer between the source and the drain of the final transistor.

20 Claims, 6 Drawing Sheets

THIN FILM TRANSISTOR

BACKGROUND OF THE INVENTION

The present invention relates to semiconductor transistors and has particular application to thin film polycrystaline transistors.

SUMMARY OF THE INVENTION

Herein the abbreviation $I_D$ is used to refer to the transistor drain current, $V_G$ is used to refer to the transistor gate voltage generally, $V_{DS}$ is used to refer to the transistor drain to source voltage, and $V_{GS}$ is used to refer to the transistor gate to source voltage. Furthermore, herein the word "on", such as in the description of one film or layer being "formed on another" is not intended to require direct contact between the two layers. That is, for example, it should not be interpreted as excluding arrangements in which another layer or film is interposed between the one layer which is formed "on" the other.

Unlike the output characteristics ($I_D$–$V_{DS}$) of single crystal MOSFETs, a saturation regime is not observed, for example, in a polycrystaline silicon thin film transistor. Instead, as shown in FIG. 1, when the device is operating above the so-called pinch-off level, generally when $V_{DS}$>$V_{GS}$, high electric fields are formed near the drain and this results in so called impact ionisation. The result is an increase in drain current $I_D$ which is often referred to as the kink effect. This effect increases power dissipation and degrades the switching characteristics in digital circuits, whilst reducing the maximum obtainable gain as well as the common mode rejection ratio in analogue circuits.

The kink effect is also affected by the so-called parasitic bipolar effect, which is well known in silicon-on-insulator (SOI) devices. This occurs when electron-hole pairs are generated with impact ionisation at high electric fields near the drain, resulting in the holes drifting towards the source and causing a potential barrier lowering at the source junction. This effect also occurs in polysilicon thin film transistors and is due to the fact that the thin film active layer acts as the base of a bipolar transistor.

Against this background and with a view to providing an improved semiconductor transistor, in a first aspect the present invention provides a method of manufacturing a semiconductor transistor having a gate, a source and a drain, comprising the steps of: providing a semiconductor layer in which the source and drain are to be formed; forming a gate insulating layer on the semiconductor layer; forming a split gate electrode on the gate insulating layer; and using the split gate electrode as a mask in the doping of a portion of the semiconductor layer between the source and the drain of the final transistor.

According to a second aspect of the present invention there is provided a semiconductor transistor comprising a substrate having an active layer formed thereon, a source and a drain formed in the active layer, a gate insulating layer formed on the active layer and a gate electrode formed on the insulating layer, wherein the gate electrode is split, the active layer has a doped region located between the source and the drain and aligned with the split in the gate electrode, and the gate electrode is aligned with the drain so as not to overlap the drain.

BRIEF DESCRIPTION OF THE DRAWINGS

Embodiments of the present invention will now be described in more detail and by way of further example only with reference to the accompanying drawings, in which.

DETAILED DESCRIPTION OF THE DRAWINGS AND PREFERRED EMBODIMENTS

Figure 1:
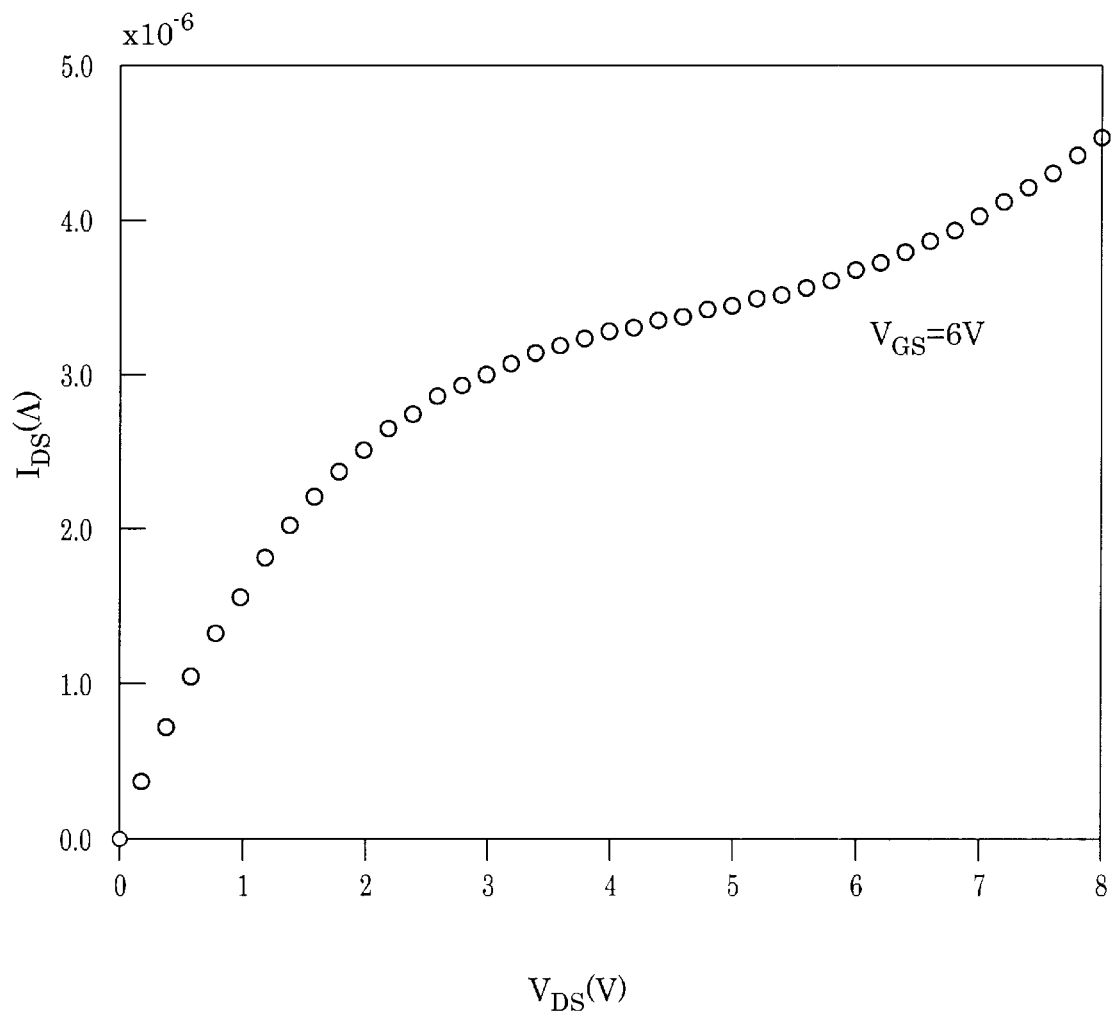
FIG. 1 illustrates the $I_D$–$V_{DS}$ output characteristic of a conventional polycrystaline silicon thin film transistor.

The formation of a gate overlapped lightly doped drain transistor will now be described with reference to FIG. 2. First, as shown in FIG. 2(a), a basic layered arrangement of: a substrate 10, a buffer oxide layer 12, an active layer of silicon 14, a gate oxide layer 16, and a mask 18 are built up in that order using known techniques. The mask layer 18 is then patterned as shown in FIG. 2(b). That is, two openings are formed in the mask such that ion implantation can be effected to form two lightly doped regions, 20 and 22, in the active layer 14; as shown in FIG. 2(c). Next the mask layer 18 is removed, as shown in FIG. 2(d). A metal is then deposited and patterned so as to form the gate electrode 24, as shown in FIG. 2(e). As shown in FIG. 2(e), the rightmost end of the gate electrode 24 is approximately aligned with the rightmost end of the lightly doped region 22. A further stage of ion implantation is then performed, as shown in FIG. 2(f), so as to form the heavily doped drain 26 and source 28 of the transistor using the gate electrode as a mask. Thus, in the final device, the gate 24 overlaps the lightly doped region 22 which forms part of the drain.

The structure shown in FIG. 2(f) has a two part drain, regions 22 and 26, and a recombination region 20. The lightly doped part of the drain, region 22, reduces the kink effect by reducing the electric field, and hence impact ionisation, near the drain. In addition, the recombination region 20 suppresses the parasitic bipolar effect by reducing the number of holes which reach the source. These advantages are significant. However, it has been found that the structure illustrated in FIG. 2(f) has a significant disadvantage in that a large gate-to-drain capacitance is established by virtue of the topography used to achieve the stated advantages.

The main processing steps for the formation of a transistor in accordance with a first embodiment of the present invention will now be described with reference to FIG. 3. As shown in FIG. 3(a), the starting position is the same as with the device described with reference to FIG. 2(a). Thus, the same reference numerals are used and the description thereof will not be repeated. In this embodiment of the invention, however, the mask layer 18 is patterned in a different formation; as shown in FIG. 3(b). Also, the next step is ion implantation to produce the heavily doped regions 30 and 32 in the active layer 14; as shown in FIG. 3(c). These heavily doped regions 30 and 32 form the drain (part of) and source, respectively, of the final transistor. The mask layer 18 is removed, as shown in FIG. 3(d) and then a metal layer is deposited and patterned so as to form the gate electrode 34; as shown in FIG. 3(e). As shown in FIG. 3(e), the gate electrode is split and the leftmost end of the gate electrode is aligned with the rightmost end of the source. The rightmost end of the gate electrode is not aligned with the leftmost end of the heavily doped region 30 but stops short thereof. Thus, the gate electrode is used as a mask for ion implantation to form two lightly doped regions 36 and 38; as shown in FIG. 3(f). The lightly doped region 36 is, of course, thus aligned with the split in the gate electrode and the lightly doped region 38 abuts the heavily doped region 30, so that regions 30 and 38 constitute the drain of the transistor. As will be readily apparent from this description and from FIG. 3(f), in this structure the gate does not overlap the drain. In operation, the split parts of the gate would normally have the same voltage applied to them.

The embodiment of the present invention shown in FIG. 3(f) retains the advantages of the recombination centre and lightly doped drain of the structure shown in FIG. 2(f). However, as already noted, the embodiment of the present invention does not have the gate overlapping the drain. In fact, they are self aligned so that they do not overlap. The result is significantly to reduce the gate-drain capacitance which degrades the performance of the structure illustrated in FIG. 2(f).

Figure 3:
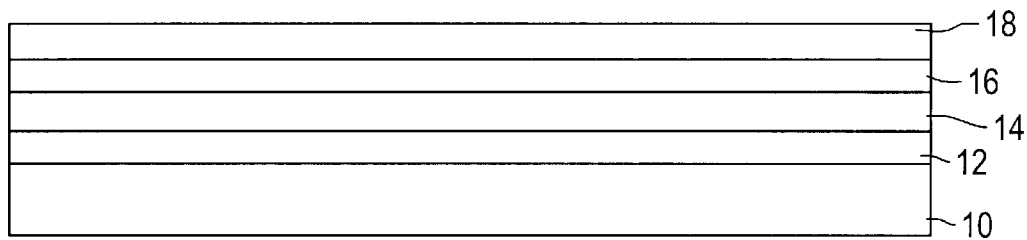
FIG. 3 illustrates the process steps for forming a split gate device according to one embodiment of the present-invention.
Figure 3:
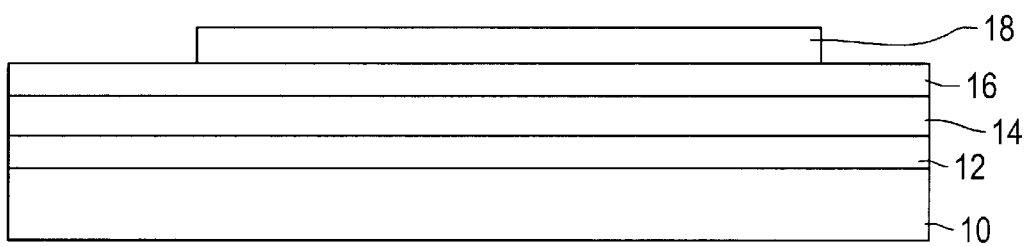
Figure 3:
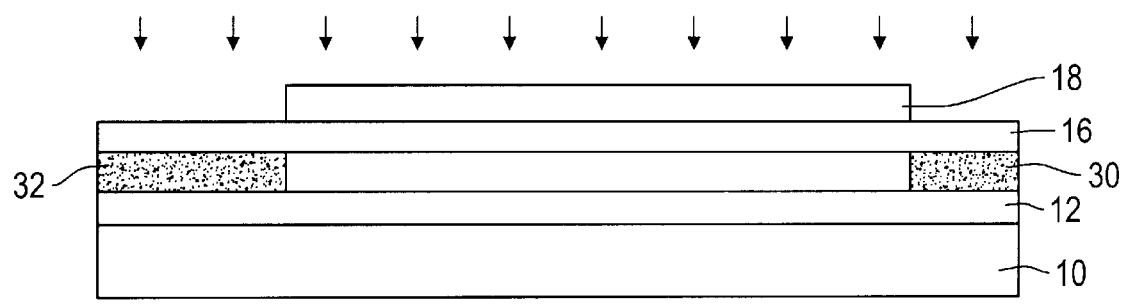
Figure 3:
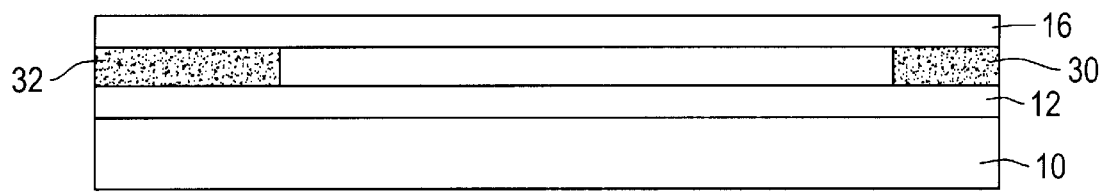
Figure 3:
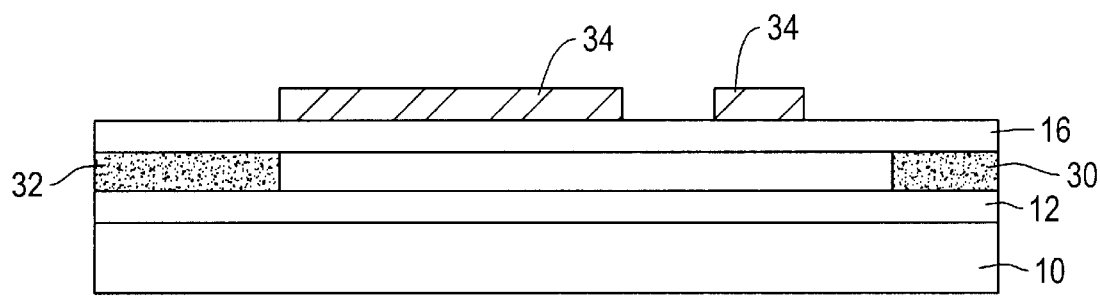
Figure 3:
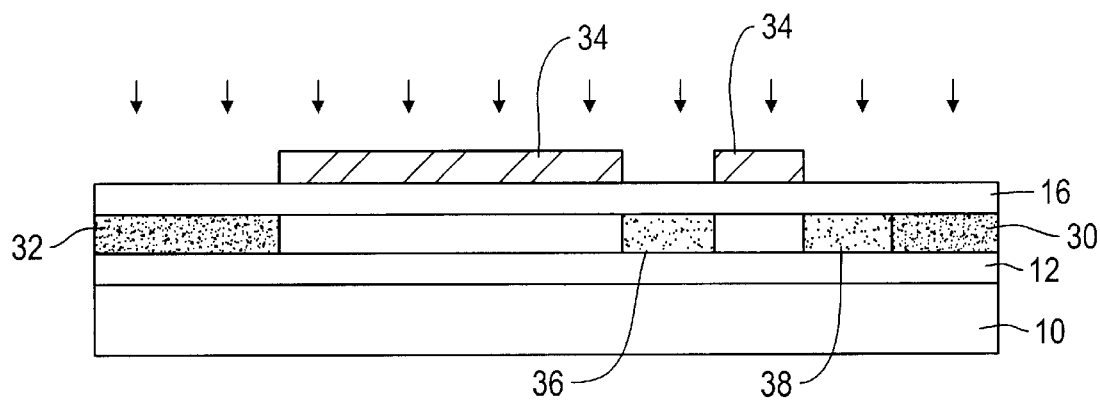
Figure 4:
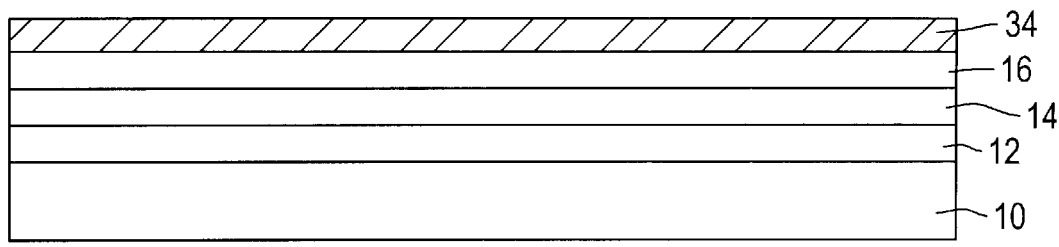
FIG. 4 illustrates the process steps for forming a split gate device according to another as embodiment of the present invention.
Figure 4:
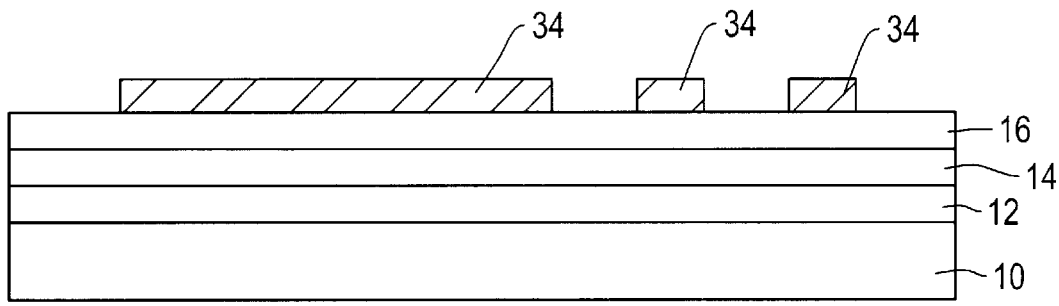
Figure 4:
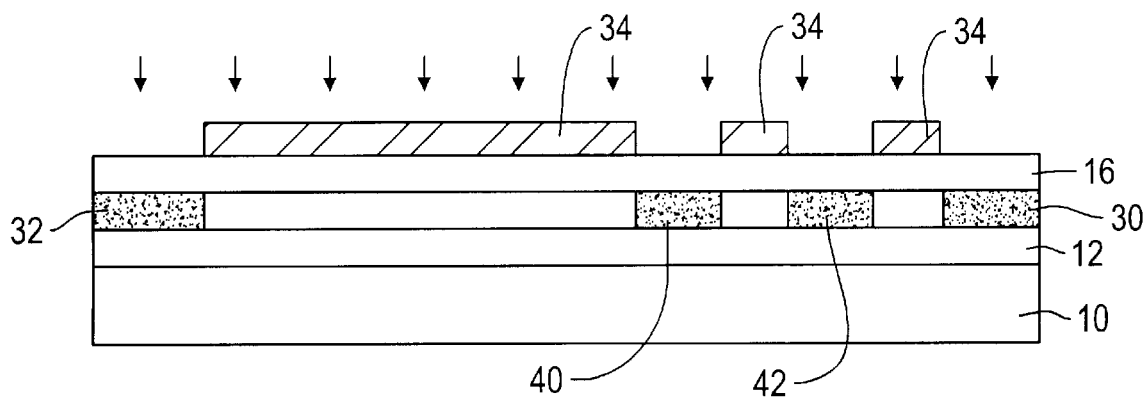

Another embodiment of the invention is illustrated in FIG. 4. Unlike the starting arrangements shown in FIGS. 2(a) and 3(a), in this embodiment the mask layer 18 is not provided but instead the metal layer 34 to form the gate electrode is first formed on the gate oxide layer 16. This is shown in FIG. 4(a). Next the metal layer is patterned to form a multiple split gate electrode 34, as shown in FIG. 4(b). It is to be noted that in the FIG. 3 embodiment a single split is formed in the gate whereas in this embodiment multiple splits are formed, with two such splits being shown. As illustrated in FIG. 4(c), the multiple split gate electrode is used as a mask for ion implantation to form heavily doped regions 30, 32, 40 and 42 in the active layer 14. The heavily doped regions 30 and 32 do, of course, form the drain and source respectively and the heavily doped regions 40 and 42 are two recombination centres, which act in a similar manner to the recombination centres 20 and 36 shown in FIGS. 2 and 3.

Figure 2:
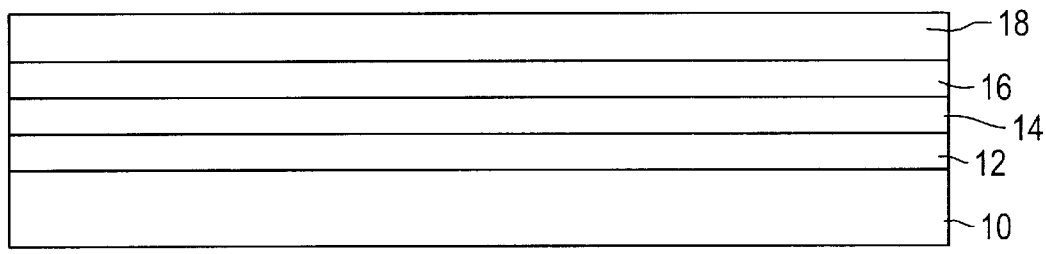
FIG. 2 illustrates the processing steps for forming a gate overlapped lightly doped drain device.
Figure 2:
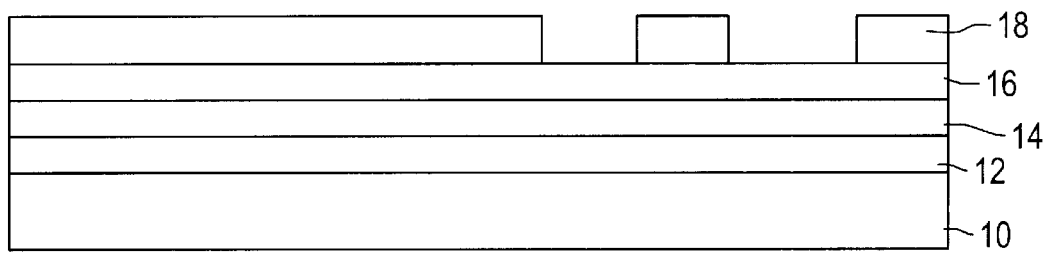
Figure 2:
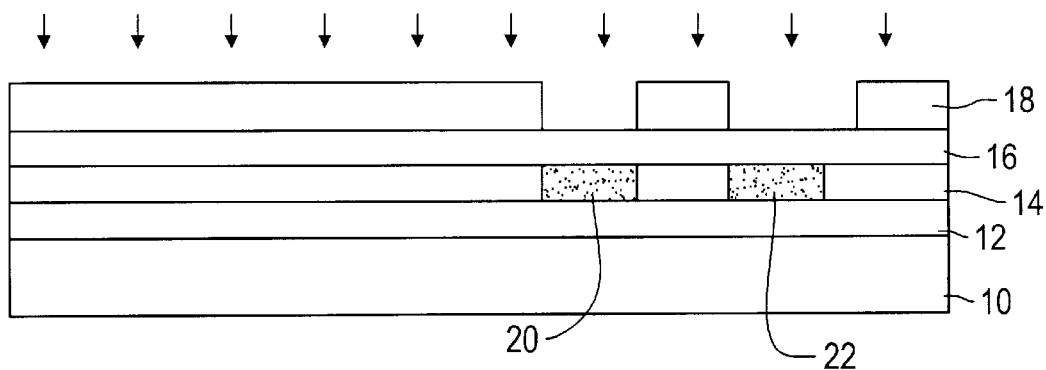
Figure 2:
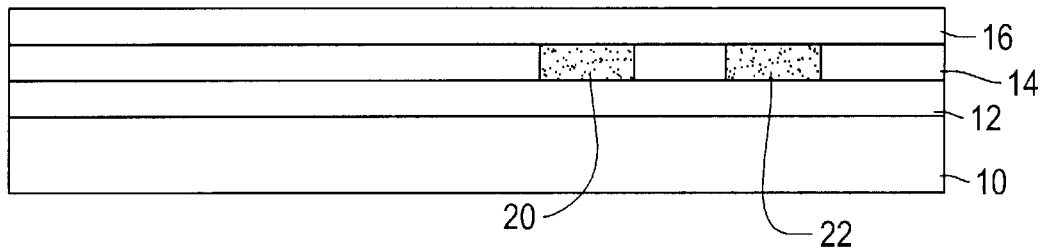
Figure 2:
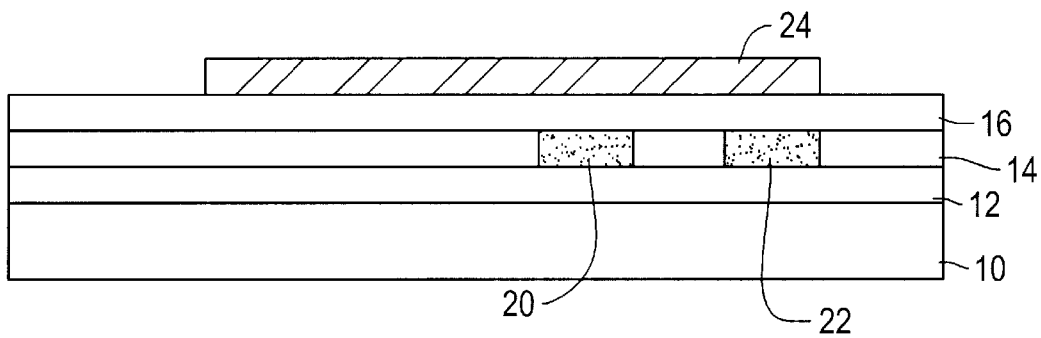
Figure 2:
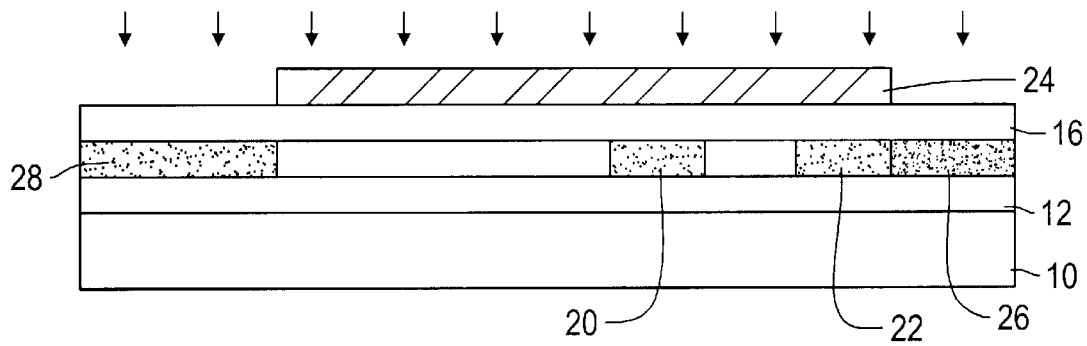

It will be immediately apparent that the number of processing steps in the embodiment of FIG. 4 is significantly reduced compared with the fabrication processes illustrated in FIGS. 2 and 3. Moreover, the whole structure is self aligned and the advantages of the FIG. 2(f) and 3(f) structures are retained. Indeed, the suppression of the kink effect and the parasitic bipolar effect are enhanced due to the presence of multiple recombination centres, ie regions 40 and 42.

In the structures illustrated in FIGS. 3(f) and 4(c), the length of the active layer between the source and the drain (ie the channel length) may typically be between 0.2 µm and 100 µm, inclusive. The length of the recombination centres may typically be between 0.02 µm and 2 µm, inclusive. The distance between the recombination centre near the drain and the drain itself may typically be between 0.02 µm and 2 µm inclusive and the distance between the recombination centres in the FIG. 4 structure may typically be between 0.02 µm and 2 µm. From this discussion of typical dimensions it will be appreciated, inter alia, that the split gate structures of the FIGS. 3 and 4 devices differs from known split gate devices since the known split gate devices have the splits evenly spaced in large dimensions across the length of the device. In this comparison reference is only being made to the gate electrode and the known split gate devices referred to have otherwise conventional structures in contrast to the recombination centres and lightly doped drains described herein.

In the embodiments of FIGS. 3 and 4, the lightly and heavily doped regions may be of either p or n type material and these may be provided by ion implementation. As will be appreciated by persons skilled in the art, other possibilities exist. Similarly, the active thin film material may be an amorphous, polycrystaline or single crystal semiconductor material.

The devices described with reference to FIGS. 3 and 4 provide suppression of the kink effect by reducing the electric field and the impact ionisation near the drain. They suppress the parasitic bipolar effect by reducing the number of generated holes reaching the source as a result of provision of the recombination centres spaced from the drain.

In the structure illustrated in FIG. 3(f), the lightly doped region 36 constitutes a series resistance in the active layer between the source and the drain. The structure illustrated in FIG. 4 does not suffer a series resistance in the active layer and the field induced leakage current is suppressed by distributing the potential drop across multiple depletion regions when the device is operating in the 'off' regime ($V_G<<0$). The benefits of the FIG. 4 structure will also be readily apparent in terms of its ease of fabrication, particularly the reduced number of process steps required.

The arrangements of FIGS. 3 and 4 provide for a large operating window for the ion implantation process, which can be as much as two orders of magnitude different from that of the FIG. 2 arrangement.

What is claimed is:

1. A method of manufacturing a semiconductor transistor having a gate, a source, a drain, and a recombination region located in closer proximity to the drain in comparison to the source, comprising the steps of:

providing a semiconductor layer in which the source, drain and recombination region are to be formed;

forming a gate insulating layer on the semiconductor layer;

forming a gate electrode on the gate insulating layer, the gate electrode having a split positioned in closer proximity to a first edge of the gate electrode in comparison to a second edge of the gate electrode opposite to said first edge; and using the gate electrode as a mask in the doping of a portion of the semiconductor layer to provide the recombination region at a position between the source and the drain in closer proximity to the drain in comparison to the source of the final transistor, thereby to reduce the kink effect of the final transistor.

2. A method as claimed in claim 1, wherein the step of using the gate electrode as a mask includes using the gate electrode as a mask in the doping of a further portion of the semiconductor layer to provide the drain aligned with said first edge of the gate electrode.

3. A method as claimed in claim 1, including the use of doping for formation of the source and wherein the step of using the gate electrode as a mask in doping involves relatively light doping as compared with the doping used for formation of the source.

4. A method claimed in claim 1, wherein between the steps of forming the gate insulating layer and forming the gate electrode, the method includes the steps of:

forming a mask, and using the mask in doping of portions of the semiconductor layer which are to form the source and drain.

5. A method as claimed in claim 1, wherein the step of forming the gate electrode involves the formation of a multiple-split gate electrode.

6. A method as claimed in claim 5, wherein the step of using the gate electrode as a mask in doping includes using the gate electrode as a mask in doping of the source and drain as well as portions of the semiconductor layer between the source and the drain.

7. A method as claimed in claim 1, wherein the split in the gate electrode is provided at a distance of between 0.02 μm and 2 μm from the first edge of the gate electrode.

8. A method as claimed in claim 2, including the use of doping for formation of the source and wherein the step of using the gate electrode as a mask in doping involves relatively light doping as compared with the doping used for formation of the source.

9. A method as claimed in claim 2, wherein between the steps of forming the gate insulating layer and forming the gate electrode, the method includes the steps of:

forming a mask, and using the mask in doping of portions of the semiconductor layer which are to form the source and drain.

10. A method as claimed in claim 2, wherein the step of forming the gate electrode involves the formation of a multiple-split gate.

11. A method as claimed in claim 3, wherein between the steps of forming the gate insulating layer and forming the gate electrode, the method includes the steps of:

forming a mask, and using the mask in doping of portions of the semiconductor layer which are to form the source and drain.

12. A method as claimed in claim 5, wherein the multiple-splits are spaced at between 0.02 μm and 2 μm on the gate electrode.

13. A semiconductor transistor comprising a substrate having an active layer formed thereon, a source, a drain and a recombination region formed in the active layer, a gate insulating layer formed on the active layer and a gate electrode formed on the insulating layer, wherein the gate electrode is split at a position in closer proximity to a first edge of the gate electrode in comparison to a second edge of said electrode opposite to the first edge, the first edge of the gate electrode is aligned with the drain so as not to overlap the drain, and the recombination region is located between the source and the drain in closer proximity to the drain in comparison to the source and aligned with the split in the gate electrode for reducing the kink effect of the transistor.

14. A semiconductor transistor as claimed in claim 13, wherein the drain comprises two regions one nearer to the source than the other with the region nearer the source being relatively lightly doped compared with the other region.

15. A semiconductor transistor as claimed in claim 13, wherein the gate is a multiple-split gate and the active layer has a plurality of recombination regions located between the source and the drain and each is aligned with a respective split in the gate electrode.

16. A semiconductor transistor as claimed in claim 13, wherein the recombination regions in the active layer between the source and the drain are located nearer the drain than the source.

17. A semiconductor transistor as claimed in claim 13, wherein the split in the gate electrode is positioned at a distance of 0.02 μm to 2 μm from the first edge of the gate electrode.

18. A semiconductor transistor as claimed in claim 14, wherein the doped region or regions in the active layer between the source and the drain are located nearer the drain than the source.

19. A semiconductor transistor as claimed in claim 15, wherein the doped region or recombination regions in the active layer between the source and the drain are located nearer the drain than the source.

20. A semiconductor transistor as claimed in claim 17, wherein the gate electrode is a multiple-split gate electrode and the multiple-splits are spaced at a distance between 0.02 μm and 2 μm on the gate electrode.

* * * * *

UNITED STATES PATENT AND TRADEMARK OFFICE
CERTIFICATE OF CORRECTION

PATENT NO. : 6,548,356 B2  Page 1 of 1
DATED : April 15, 2003
INVENTOR(S) : Basil Lui et al.

It is certified that error appears in the above-identified patent and that said Letters Patent is hereby corrected as shown below:

<u>Title page,</u>
Item [75], please correct the first and second inventor's residence as follows:
-- [75] Inventors: Basil Lui, Singapore (SG);
Piero Migliorato, Cambridge (GB) --

Signed and Sealed this

Nineteenth Day of August, 2003

JAMES E. ROGAN
*Director of the United States Patent and Trademark Office*